(12) United States Patent
Nishimura et al.

(10) Patent No.: US 10,141,112 B2
(45) Date of Patent: Nov. 27, 2018

(54) LAMINATED ELECTRONIC COMPONENT AND MOUNTING STRUCTURE THEREOF

(71) Applicant: KYOCERA Corporation, Kyoto-shi, Kyoto (JP)

(72) Inventors: Michiaki Nishimura, Higashine (JP); Yasuhisa Shigenaga, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/325,193

(22) PCT Filed: Jul. 28, 2015

(86) PCT No.: PCT/JP2015/071365
§ 371 (c)(1),
(2) Date: Jan. 10, 2017

(87) PCT Pub. No.: WO2016/017634
PCT Pub. Date: Feb. 4, 2016

(65) Prior Publication Data
US 2017/0186545 A1 Jun. 29, 2017

(30) Foreign Application Priority Data

Jul. 30, 2014 (JP) .................................. 2014-155083

(51) Int. Cl.
*H01G 4/228* (2006.01)
*H01G 4/30* (2006.01)
(Continued)

(52) U.S. Cl.
CPC ............. *H01G 4/30* (2013.01); *H01G 4/005* (2013.01); *H01G 4/12* (2013.01); *H01G 4/228* (2013.01);
(Continued)

(58) Field of Classification Search
CPC .......... H01G 4/005; H01G 4/30; H01G 4/228; H01G 4/012; H01G 4/232; H01G 4/248; H01G 4/252
(Continued)

(56) References Cited

U.S. PATENT DOCUMENTS 6,576,497 B2 * 6/2003 Ahiko ................... H01G 4/012
257/700
2006/0221546 A1 10/2006 Togashi
(Continued)

FOREIGN PATENT DOCUMENTS

CN 1841592 A 10/2006
JP 2006-286930 A 10/2006
(Continued)

OTHER PUBLICATIONS

International Search Report, PCT/JP2015/071365, dated Oct. 13, 2015, 2 pgs.
(Continued)

*Primary Examiner* — Chau N Nguyen
*Assistant Examiner* — Roshn Varghese
(74) *Attorney, Agent, or Firm* — Volpe and Koenig, P.C.

(57) ABSTRACT

A laminated electronic component includes: a rectangular parallelepiped-shaped stacked body including dielectric layers and internal electrode layers which are alternately laminated; and a pair of first conductors and a pair of second conductors which are disposed on an outer surface of the stacked body. The first conductors are disposed in portions which include centers of long sides of a first principal surface which is positioned in a direction of lamination of the dielectric layers and the internal electrode layers of the stacked body, and do not include a vertex of the stacked body so as to extend from first side surfaces to the first principal surface. The second conductors are disposed on
(Continued)

second side surfaces, and the first conductors and the second conductors are spaced apart from each other on an outer surface and electrically connected to each other via the internal electrode layers.

5 Claims, 14 Drawing Sheets

(51) Int. Cl.
 *H01G 4/005* (2006.01)
 *H01G 4/12* (2006.01)
 *H05K 1/18* (2006.01)
(52) U.S. Cl.
 CPC ... *H05K 1/181* (2013.01); *H05K 2201/10015* (2013.01)
(58) Field of Classification Search
 USPC .... 361/306.1, 303, 306.3, 308.1, 298.4, 309
 See application file for complete search history.

(56) References Cited

U.S. PATENT DOCUMENTS

| | | | |
|---|---|---|---|
| 2013/0056252 | A1 | 3/2013 | Fujii et al. |
| 2013/0233606 | A1 | 9/2013 | Fujii et al. |
| 2014/0008116 | A1 | 1/2014 | Fujii et al. |
| 2015/0325372 | A1* | 11/2015 | Lee .......................... H01G 4/30 174/260 |

FOREIGN PATENT DOCUMENTS

| | | |
|---|---|---|
| JP | 2012-069766 A | 4/2012 |
| JP | 2013-065820 A | 4/2013 |
| KR | 20140038876 A | 3/2014 |

OTHER PUBLICATIONS

Chinese Office Action with English concise explanation, Chinese Patent Application No. 201580038011.1, dated Jan. 22, 2018, 9 pgs.

* cited by examiner (a)

(b)

(a)

(b)

LAMINATED ELECTRONIC COMPONENT AND MOUNTING STRUCTURE THEREOF

TECHNICAL FIELD

The present invention relates to a laminated electronic component and a mounting structure thereof.

BACKGROUND ART

In an electronic component of laminated-type composed of a stack of dielectric layers and internal electrode layers, when a DC voltage and an AC voltage are simultaneously applied to an electronic component, distortion occurs in the dielectric layers due to an electrostriction effect by the DC voltage and the electronic component itself vibrates due to the AC voltage. A substrate on which the electronic component is mounted by solder or the like vibrates due to the vibration of the electronic component and when the substrate resonates at a resonance frequency in an audible range, a vibration sound called "acoustic noise" occurs.

In order to reduce such "acoustic noise", a method for reducing the vibration by suppressing distortion of the electronic component itself (for example, using a low dielectric constant material having a small electrostriction effect, suppressing the electrostriction effect by an internal electrode pattern, and the like), or a method for suppressing transmission of the vibration to the substrate by absorbing vibration of the electronic component (for example, absorbing vibration by metal terminals and leads, regulating a height of a solder fillet, and the like) has been proposed. For example, in Patent Literature 1, a mounting structure, in which a conductive material which is a propagation medium of vibration of a capacitor is separated from the most vibrating portion of the capacitor, is provided and thereby the vibration is unlikely to transmit to a circuit substrate, is disclosed.

CITATION LIST

Patent Literature

Patent Literature 1: Japanese Unexamined Patent Publication JP-A 2013-065820

SUMMARY OF INVENTION

Technical Problem

However, in a case where the distortion of the electronic component itself is suppressed, there is a problem that a capacity cannot be ensured, for example, in a case of a capacitor because a dielectric constant of a material is low and a capacity developing region is small. In addition, in a case where the vibration is absorbed by the metal terminals or the leads, or even in the mounting structure as described in Patent Literature 1, there was a problem that an attenuation effect of the vibration sufficient for a complicated manufacturing process or mounting process cannot be obtained.

The invention is made in view of the problems described above, and an object thereof is to provide a laminated electronic component capable of reducing acoustic noise when mounting the laminated electronic component on a substrate, and amounting structure thereof.

Solution to Problem

A laminated electronic component according to an embodiment of the invention includes a stacked body having a rectangular parallelepiped shape, the stacked body comprising dielectric layers and internal electrode layers which are alternately laminated; and a pair of first conductors and a pair of second conductors disposed on an outer surface of the stacked body, the stacked body comprising a pair of first and second principal surfaces which has a rectangular shape and is positioned in a direction of lamination of the dielectric layers and the internal electrode layers, a pair of first side surfaces adjacent to long sides of the pair of first and second principal surfaces, and a pair of second side surfaces adjacent to short sides of the pair of first and second principal surfaces, the pair of first conductors being disposed in portions which include centers of the long sides or the short sides of the first principal surface or the second principal surface, and do not include a vertex of the stacked body, and the pair of first conductors comprising side surface sections which extend from the long sides on the pair of first side surfaces or from the short sides on the pair of second side surfaces, and projection sections which extend from the long sides or the short sides on the first principal surface or the second principal surface, the pair of second conductors being disposed on the pair of first side surfaces or the pair of second side surfaces, and the pair of first conductors and the pair of second conductors being spaced apart from each other on the outer surface and electrically connected to each other via the internal electrode layers.

A mounting structure according to an embodiment of the invention includes the laminated electronic component mentioned above; and a substrate which is joined with the projection sections of the pair of first conductors of the laminated electronic component.

Advantageous Effects of Invention

According to the invention, it is possible to provide the laminated electronic component and the mounting structure thereof which are capable of reducing acoustic noise when mounting the laminated electronic component on the substrate.

BRIEF DESCRIPTION OF DRAWINGS

FIG. 1(b) is a sectional view taken along the line A1-A1 of FIG. 1(a), and FIG. 1(c) is a sectional view taken along the line A2-A2;

FIG. 2(c) is a plan view of FIG. 1(a) as viewed from the first principal surface side;

FIG. 5 illustrates another example of the first embodiment, in which FIG. 5(a) is a perspective view and FIG. 5(b) is a sectional view taken along the line B1-B1 of FIG. 5(a);

FIG. 6 illustrates a laminated electronic component according to a second embodiment, in which FIG. 6(a) is a perspective view and FIG. 6(b) is a plan view as viewed from the first principal surface side of FIG. 6(a);

FIG. 8(c) illustrates a mounting structure of the related art in which the laminated electronic component is mounted on a substrate, and is a sectional view of line D-D of FIG. 8(b);

FIG. 10 illustrates a sound pressure level of a laminated ceramic capacitor in the mounting structure of the related art, in which FIG. 10(a) is a graph illustrating a measured sound pressure level and FIG. 10 (b) is a graph illustrating a sound pressure level which is obtained by simulation;

FIG. 13 is a perspective view illustrating a calculation result of a vibration mode of the laminated ceramic capacitor of the related art at 10 kHz, in which FIG. 13(a) is a view as viewed from a symmetry plane side and FIG. 13(b) is a view as viewed from a surface side.

DESCRIPTION OF EMBODIMENTS

Figure 1:
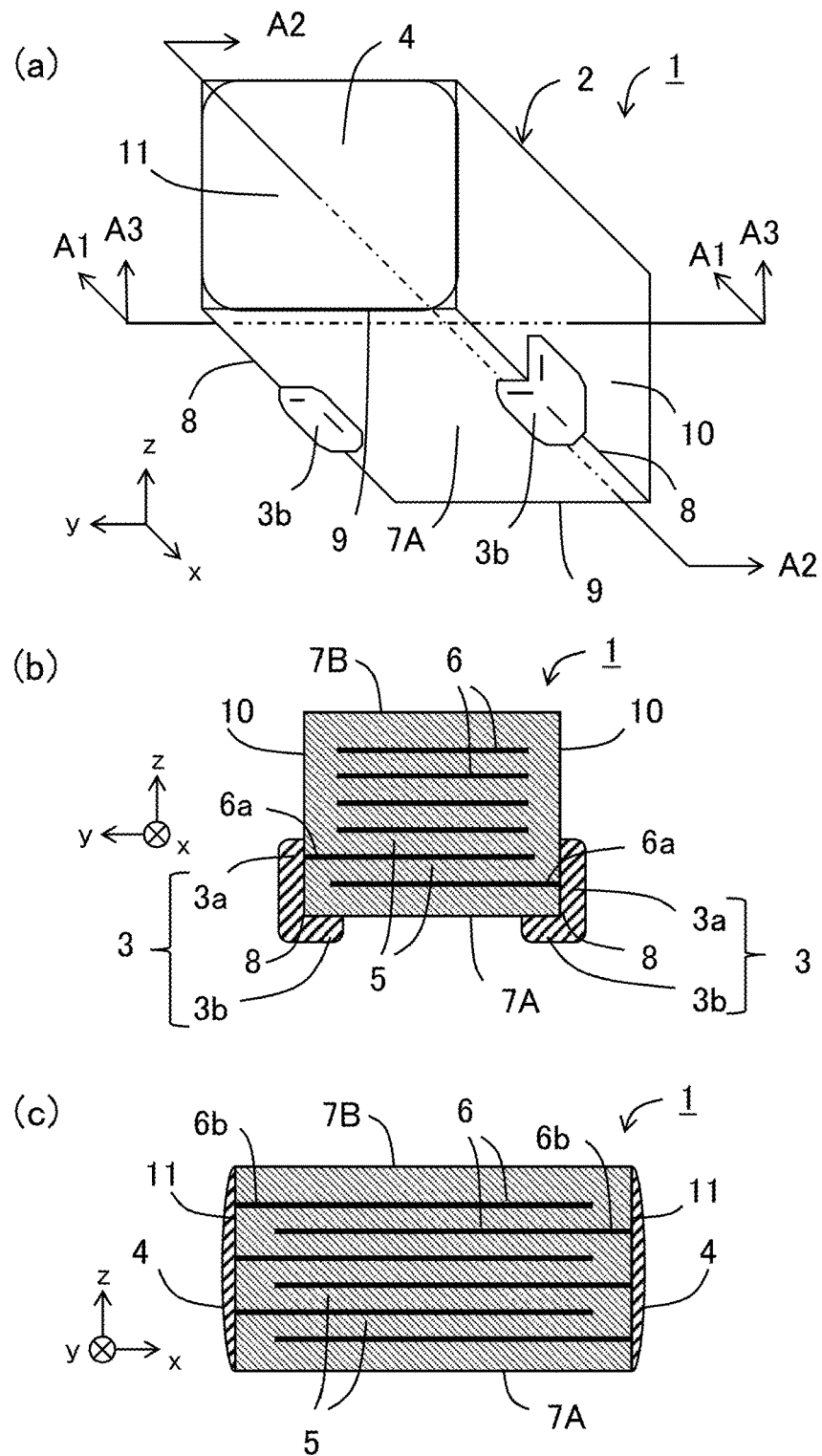
FIG. 1 illustrates a laminated electronic component according to a first embodiment, in which FIG. 1 (a) is a perspective view.

A laminated electronic component and amounting structure will be described with reference to the drawings. Moreover, in each drawing, the same reference numerals are given to the same members and portions and duplicate description will be omitted. Some of the reference numerals are omitted in some drawings. In addition, for ease of description, xyz coordinate axes are attached to each drawing.

<First Embodiment>

As illustrated in FIGS. 1(a) to 1(c), a laminated electronic component 1 according to a first embodiment includes a rectangular parallelepiped-shaped stacked body 2, a pair of first conductors 3, and a pair of second conductors 4 disposed on an outer circumferential side surface. FIG. 1 (b) is a sectional view taken along the line A1-A1 of FIG. 1 (a) and as illustrated in FIG. 1 (b) the stacked body 2, in which dielectric layers 5 and internal electrode layers 6 are alternately laminated in a z-axis direction of a coordinate axis, is provided. Moreover, a direction of lamination of the dielectric layers 5 and the internal electrode layers 6 may be simply referred to as the direction of lamination.

A first principal surface 7A and a second principal surface 7B which are a pair of opposed rectangular principal surfaces are positioned in the direction of lamination of the stacked body 2 in the laminated electronic component 1 of the embodiment. Both of the first principal surface 7A and the second principal surface 7B are configured of a pair of long sides 8 and a pair of short sides 9. The stacked body 2 has a pair of opposed first side surfaces 10 adjacent to the long sides 8 and a pair of opposed second side surfaces 11 adjacent to the short sides 9 of the first and second principal surfaces 7A and 7B The first conductor 3 has a side surface section 3a disposed on the first side surface 10 and a projection section 3b extending from the side surface section 3a on the first principal surface 7A. The side surface section 3a is disposed closer to the first principal surface 7A than a center portion of the first side surface 10 in the direction of lamination. The second conductor 4 is disposed on the second side surface 11 and is spaced apart from the first conductor 3. That is, the first conductor 3 and the second conductor 4 are spaced apart from each other and are not connected to each other on the outer surface of the stacked body 2.

Figure 2:
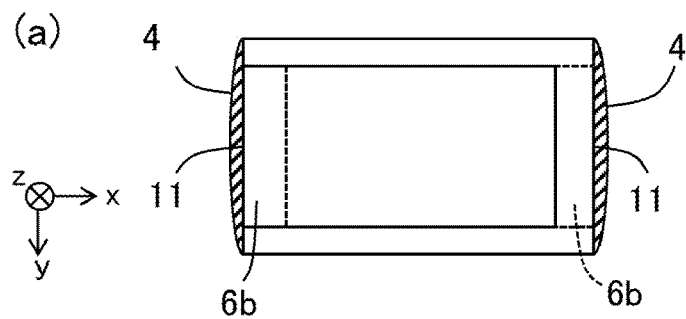
FIG. 2 (a) is a sectional view taken along the line A3-A3 of FIG. 1(a), FIG. 2 (b) is a sectional view on a first principal surface side compared to FIG. 2(a)
Figure 2:
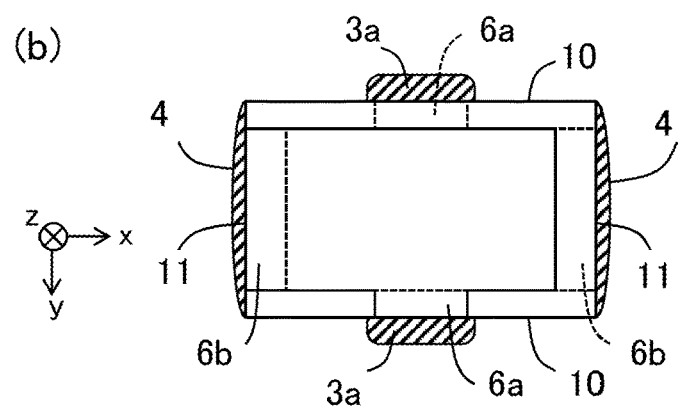
Figure 2:
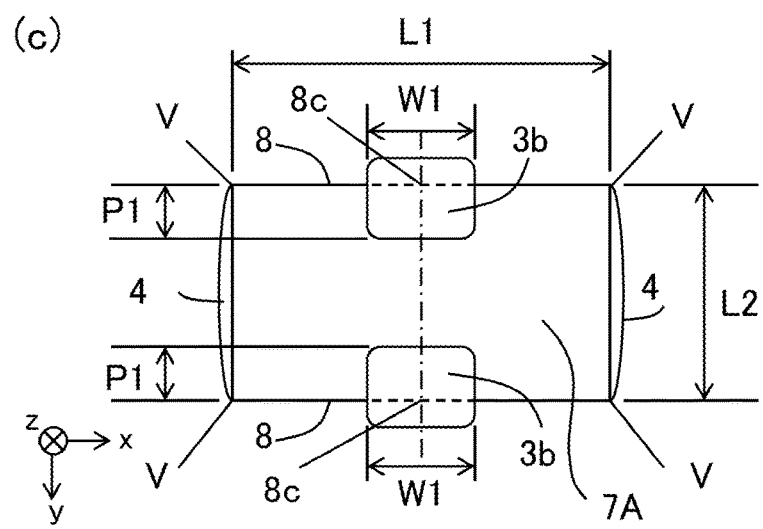

In the embodiment, as illustrated in FIGS. 2(a) and 2(b), at least two types of the internal electrode layers 6 exist. That is, one is an internal electrode layer 6 including only lead-out sections 6b (FIG. 2 (a)) and the other is an internal electrode layer 6 including lead-out sections 6a and the lead-out sections 6b (FIG. 2(b)).

As illustrated in FIG. 2(a), the internal electrode layers 6 including only the lead-out sections 6b are further composed of an internal electrode layer 6 including the lead-out section 6b indicated by a solid line and an internal electrode layer 6 including the lead-out section 6b indicated by a broken line. As illustrated in FIG. 1(c), the former and the latter internal electrode layers 6 are alternately laminated. The lead-out section 6b indicated by the solid line is exposed to the second side surface 11 which is positioned on a left side in FIG. 2(a) and the lead-out section 6b indicated by the broken line is exposed to the second side surface 11 which is positioned on a right side in FIG. 2(a).

As illustrated in FIG. 2(b), the internal electrode layers 6 including the lead-out sections 6a and the lead-out sections 6b are further composed of an internal electrode layer 6 including the lead-out sections 6a and 6b indicated by solid lines and an internal electrode layer 6 including the lead-out sections 6a and 6b indicated by broken lines. In FIG. 2(b), the lead-out section 6a indicated by the solid line is exposed to the first side surface 10 which is positioned on a lower side and the lead-out section 6b indicated by the solid line is exposed to the second side surface 11 which is positioned on the left side. The lead-out section 6a indicated by the broken line is exposed to the first side surface 10 which is positioned on an upper side and the lead-out section 6b indicated by the broken line is exposed to the second side surface 11 which is positioned on the right side.

In FIGS. 2(a) and 2(b), the internal electrode layers 6 including the lead-out sections 6b indicated by the solid lines are electrically connected to each other by the second conductor 4 on the left side and are further electrically connected to the side surface sections 3a of the first conductors 3 on the lower side by the lead-out sections 6a indicated by the solid lines. The internal electrode layers 6 including the lead-out sections 6b indicated by the broken lines are electrically connected to each other by the second conductor 4 on the right side and are further electrically connected to the side surface sections 3a of the first conductors 3 on the upper side by the lead-out sections 6a indicated by the broken lines.

As described above, the lead-out sections 6a are disposed so as to be alternately exposed to any one of the pair of first side surfaces 10 and are electrically connected to the side surface sections 3a of the first conductors 3. The lead-out sections 6b are disposed so as to be alternately exposed to any one of the pair of second side surfaces 11 and are electrically connected to the second conductors 4. The internal electrode layers 6 including the lead-out sections 6a and 6b are disposed such that conduction is not disposed between the first conductors 3 and between the second conductors 4. Moreover, in FIG. 1(b), an example in which the lead-out section 6a of one layer of the internal electrode layers 6 is connected to each of the pair of first conductors 3, is illustrated, but the lead-out sections 6a of plural layer of the internal electrode layers 6 may be connected to each of the pair of first conductors 3.

The internal electrode layer 6 (FIG. 2(b)) including the lead-out sections 6a and 6b is positioned closer to the first principal surface 7A than the center portion in the direction of lamination in the first side surface 10 and the internal electrode layer 6 (FIG. 2(a)) including only the lead-out sections 6b configures the other internal electrode layers 6.

FIG. 2(c) is a plan view of the laminated electronic component 1 according to the embodiment as viewed from the first principal surface 7A side and illustrates dimensions of each portion. As illustrated in FIG. 2(c), the first conductors 3 include center portions 8c of the long sides 8 and are positioned at portions which do not include vertexes V of the stacked body 2. Moreover, the center portion 8c of the long side 8 is a bisecting point bisecting a length of the long side 8.

Since an exposed section of the lead-out section 6a in the first side surface 10 is directivity connected to the first conductor 3, from the viewpoint that symmetry of vibration is maintained and factors causing vibration of the substrate can be reduced when being mounted, it is preferable that the center portions 8c of the long sides 8 are included.

Moreover, structures of the dielectric layers 5 and the internal electrode layers 6 illustrated in FIG. 1(b) are schematic, and actually, a laminated electronic component, in which the dielectric layers 5 and the internal electrode layers 6 of several layers to hundreds layers are laminated, is often used. This also applies to other embodiments described later.

The dimensions of each portion will be described with reference to FIG. 2(c). In FIG. 2(c), the length of the long side 8 is L1 and a length of the short side 9 is L2. W1 is a length of the first conductor 3 in a length direction (x-axis direction) of the long side 8 and P1 is a length of the projection section 3b in a direction (y-axis direction) perpendicular to the long side 8. From the viewpoint of reduction of the vibration of the substrate during being mounted on the substrate, it is preferable that a ratio (W1/L1) of W1 to L1 is equal to or less than 0.35 and, from the viewpoint of mounting reliability, is equal to or greater than 0.2.

Figure 3:
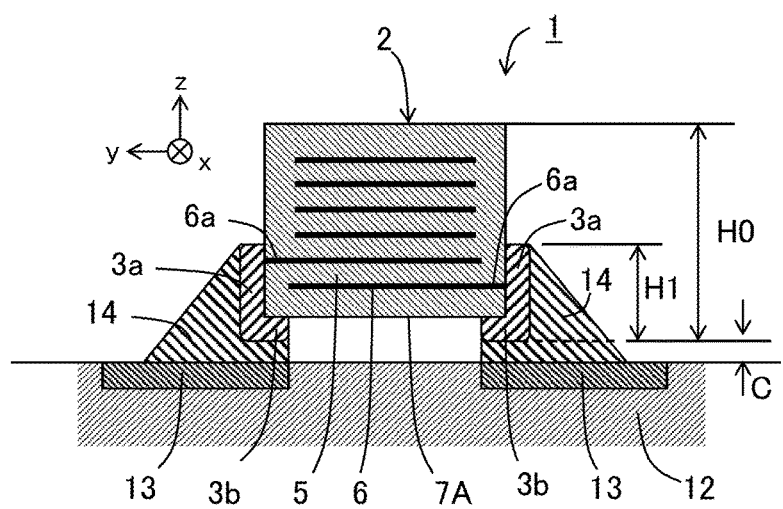
FIG. 3 is a sectional view taken along the line A1-A1 of FIG. 1(a) illustrating a mounting structure in which the laminated electronic component is mounted on a substrate according to the first embodiment.

The mounting structure of the laminated electronic component of the embodiment will be described. FIG. 3 is a sectional view illustrating a state where the laminated electronic component 1 is mounted on a substrate 12. In the mounting structure of the embodiment, as illustrated in FIG. 3, the projection sections 3b of the first conductors 3 of the laminated electronic component 1 and land patterns 13 on the substrate 12 are joined via a conductive material such as solder. Here, the laminated electronic component 1 and the substrate 12 are joined so as to be opposed with a predetermined gap between the first principal surface 7A and a mounting surface of the substrate 12. Conductive layers 14 such as solder applied on the land patterns 13 are formed between the first conductors 3 and the land patterns 13. As described above, in a case where the laminated electronic component 1 is mounted on the substrate 12 by applying the conductive material, the conductive material to be used is not particularly limited as long as the conductive material has good wettability with the first conductor 3.

In FIG. 3, H0 is a height of the laminated electronic component 1 in the direction of lamination (z-axis direction) of the stacked body 2, H1 is a length in the direction of lamination (z-axis direction) of the side surface section 3a of the first conductor 3 on the first side surface 10, and C is a gap between the mounting surface of the substrate 12 and the laminated electronic component 1.

Figure 8:
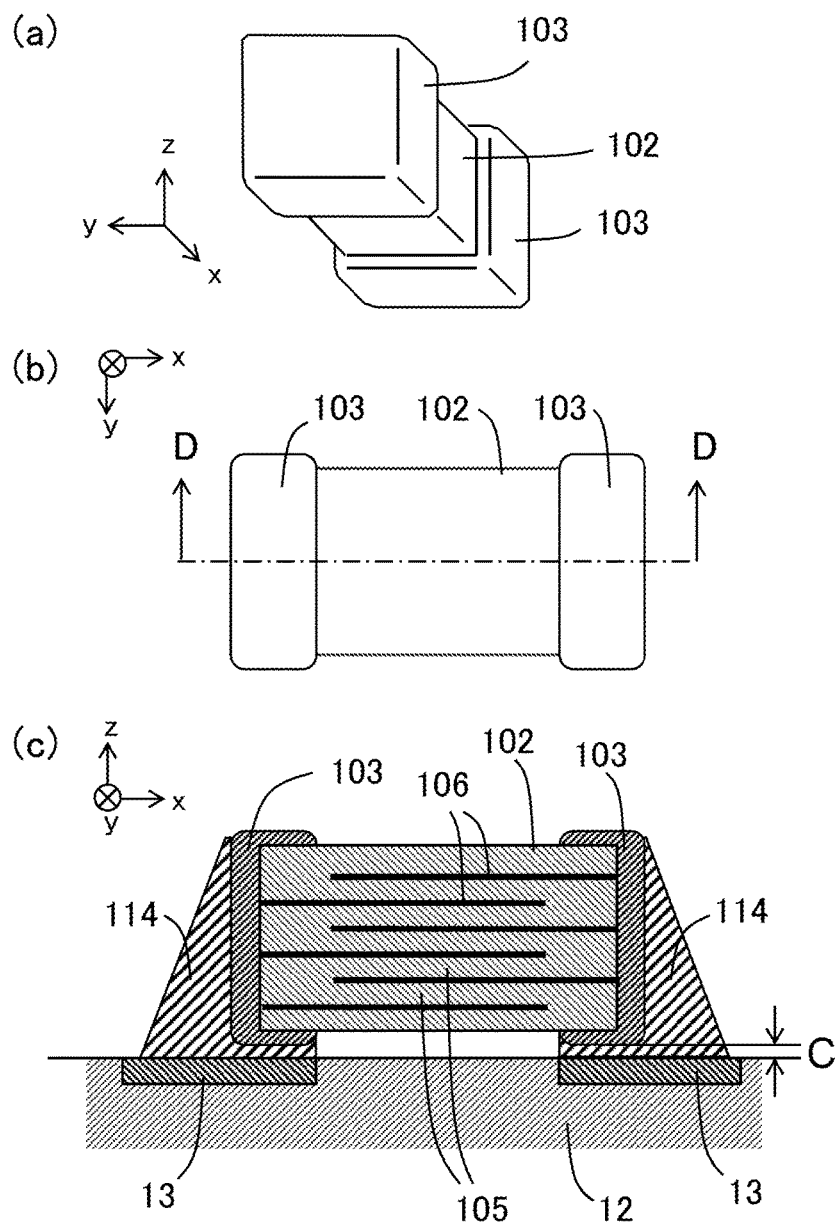
FIG. 8 illustrates a laminated electronic component of the related art, in which FIG. 8 (a) is a perspective view, FIG. 8 (b) is a plan view as viewed from a z-axis direction of a coordinate axis.

On the other hand, as illustrated in FIG. 8(a), the laminated electronic component of the related art includes a rectangular parallelepiped-shaped stacked body 102 and external electrodes 103 respectively disposed on outer surfaces of both end portions. FIG. 8(b) is a plan view as viewed from a z-axis direction of FIG. 8(a) and FIG. 8 (c) is a sectional view illustrating a mounting structure of the related art.

As illustrated in FIG. 8(c), the stacked body 102 comprises a stack in which dielectric layers 105 and internal electrode layers 106 are alternately laminated. The internal electrode layers 106 are electrically connected to the external electrodes 103 in one of both end surfaces of the stacked body 102.

For example, in a laminated ceramic capacitor which is one of the laminated electronic components, as the dielectric layer 105, a ferroelectric material such as barium titanate is used, and as the internal electrode layer 106, a metal material such as Ni is used. In addition, usually, the external electrode 103 is formed by baking Cu paste as a base electrode and applying Ni and Sn plating on a surface thereof.

In the laminated electronic component of the related art, as illustrated in FIG. 8(c), the external electrodes 103 and land patterns 13 on a substrate 12 are fixed in a state of being electrically connected via solders 114. Gaps between the external electrodes 103 and the land patterns 13 are filled with the solders 114, and the solders 114 further covers the external electrodes 103 covering end surfaces, side surfaces, and a part of upper and lower surfaces of the stacked body 102.

When an AC voltage together with a DC voltage (DC bias) is applied to the laminated ceramic capacitor which is mounted in such a state, a piezoelectric property occurs in the dielectric layers 105 due to the electrostriction effect by the DC voltage and piezoelectric vibration occurs due to the AC voltage. Furthermore, the piezoelectric vibration of the laminated ceramic capacitor is transmitted to the substrate 12 via the solders 114, and the substrate 12 vibrates. When the substrate 12 resonates at a resonance frequency in an audible range, a vibration sound called "acoustic noise" occurs.

As an example, in a case of a mounting structure of the related art in which the laminated ceramic capacitor which is the laminated electronic component of the related art is mounted on the substrate 12, acoustic noise was measured. For the measurement, as the laminated ceramic capacitor, Type 1005 laminated ceramic capacitor (capacity 10 µF, rated voltage 4V, hereinafter, referred to as an evaluation component) and as the substrate 12, a substrate formed of a FR material of 100×40 mm and thickness of 0.8 mm were used. The laminated ceramic capacitor was mounted on a center of the substrate 12 using solder of Sn—Ag—Cu (SAC) type. After mounting the evaluation component on the substrate 12, a mounting state was observed with a microscope, and it was confirmed that a fillet height of the solder 114 was 460 µm and a gap C between the substrate 12 and the evaluation component was 45 µm.

Figure 9:
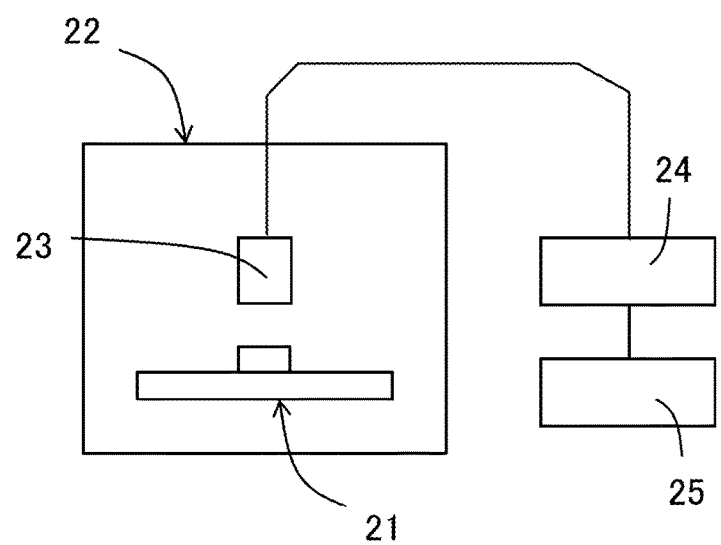
FIG. 9 is a schematic view of a measuring device of a sound pressure level.

As illustrated in FIG. 9, the measurement was performed using a measuring device of a sound pressure level. A mounting substrate (hereinafter, simply referred to as the mounting substrate) in which the evaluation component is mounted on the substrate 12 was installed within an anechoic box 22 (inner dimensions 600×700 mm and height 600 mm) and acoustic noise was collected by a sound collecting microphone 23 installed at a position away 3 mm from the center of the substrate 12 in a direction perpendicular to the substrate 12. A sound pressure level of the collected sound was measured by an amplifier 24 and a FET analyzer 25 (DS2100 manufactured by Ono Sokki Co., Ltd.). An acoustic noise measurement result is illustrated in FIG. 10(a) when applying the DC voltage (DC bias) of 4 V and the AC voltage of 20 Hz to 20 kHz and 1 Vp-p to the laminated ceramic capacitor.

Figure 10:
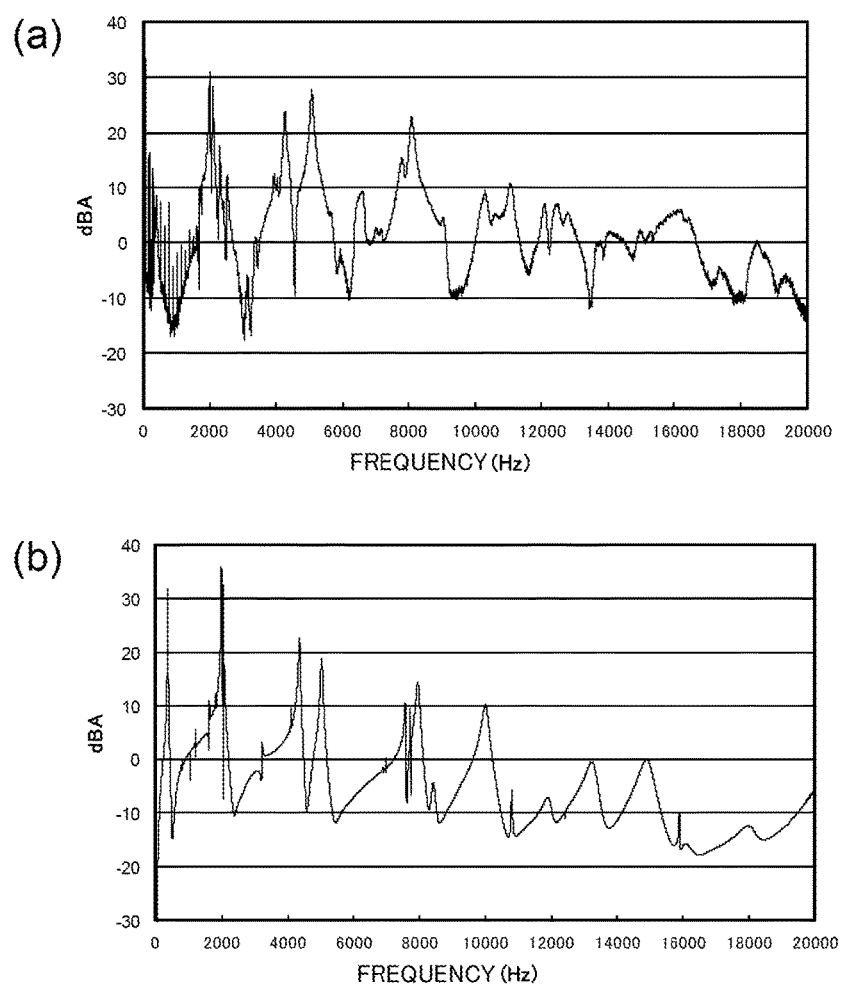

Moreover, in FIG. 10(a), the sound pressure level is indicated by A characteristic sound pressure level (dBA) and 0 dBA corresponds to the lowest sound pressure level that a person hears as a sound. This is the sound pressure level weighted for each frequency so as to be close to hearing of a person and is described in a sound level meter (noise meter) standard (JISC 1509-1:2005).

Figure 11:
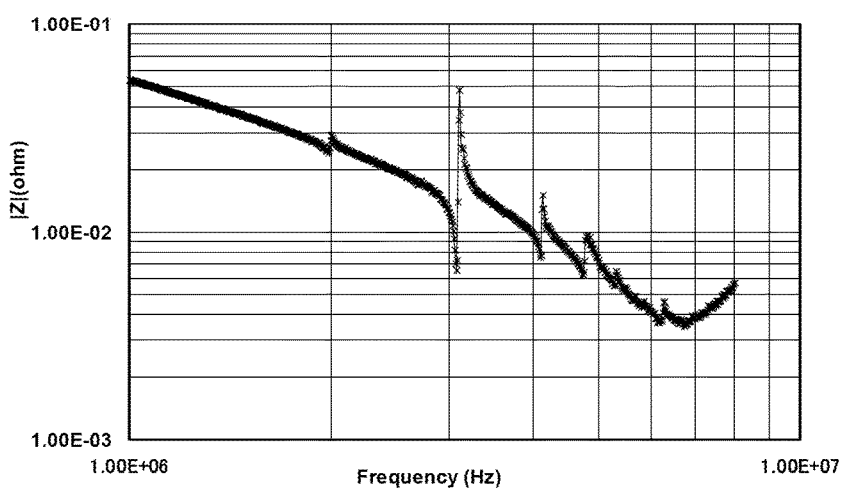
FIG. 11 is a graph illustrating an impedance measurement result in a case where DC bias of 4V is applied to a laminated ceramic capacitor of the related art.

Next, simulation of the piezoelectric vibration of the laminated ceramic capacitor was performed. First, in a state where the DC voltage (DC bias) of 4V is applied to the evaluation component, impedance is measured. A measurement result is illustrated in FIG. 11.

Figure 12:
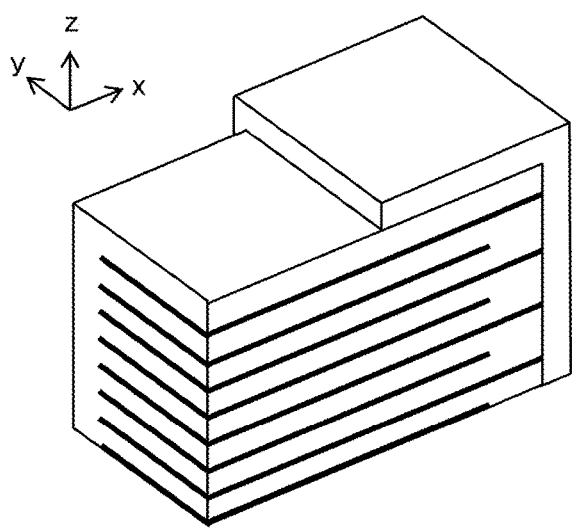
FIG. 12 is a schematic view of a model of a finite element method used for simulation of impedance of the laminated ceramic capacitor of the related art.

Simulation of the impedance was performed by using a model (dielectric material: barium titanate based material, internal electrode: Ni, external electrode: Cu, stacked body dimensions: 1100×620×620 µm, and external electrode thickness 20 µm) based on the evaluation component. For piezoelectric resistance peaks existing in a frequency region of 2 GHz or more, fitting of material parameters of the evaluation component was performed so as to match an actually measured value. FIG. 12 schematically illustrates a model of a finite element method using the simulation of the impedance. This is a ⅛ model considering symmetry and two cross sections appearing on a front surface and a cross section on a lower side of FIG. 12 are symmetrical surfaces.

The parameters (elastic stiffness $c_{ij}$ and piezoelectric constant $e_{ij}$) of the dielectric layer 105 obtained by fitting are indicated in Table 1. From Table 1, it can be seen that there is anisotropy ($c_{11}>c_{33}$ and $c_{22}>c_{33}$) in the material characteristic of the dielectric layer 105 of the evaluation component. This may be caused by a compression stress by the internal electrode layers 106.

TABLE 1

Elastic Stiffness and Piezoelectric Constant of Dielectric Layer

| | |
|---|---|
| $c_{11}^E$ | $281.5 \times 10^9$ N/m² |
| $c_{12}^E$ | $117.2 \times 10^9$ N/m² |
| $c_{13}^E$ | $57.2 \times 10^9$ N/m² |
| $c_{22}^E$ | $230.8 \times 10^9$ N/m² |
| $c_{23}^E$ | $57.2 \times 10^9$ N/m² |
| $c_{33}^E$ | $104.3 \times 10^9$ N/m² |
| $c_{44}^E$ | $30.9 \times 10^9$ N/m² |
| $c_{55}^E$ | $30.9 \times 10^9$ N/m² |
| $c_{66}^E$ | $68.9 \times 10^9$ N/m² |
| $e_{31}$ | $-22.2$ C/m² |
| $e_{32}$ | $-27.8$ C/m² |
| $e_{33}$ | $4.75$ C/m² |
| $e_{15}$ | $2.94$ C/m² |
| $e_{24}$ | $2.94$ C/m² |

A model of the mounting structure was created and simulation was performed based on the parameters of the obtained dielectric layer 105 and the mounting substrate 21 (fillet height 460 µm and a gap between the substrate and the evaluation component 45 µm) which is used in the measurement. FIG. 10(b) is a graph illustrating a result which is obtained by converting a vibration amplitude of the mounting substrate 21 obtained by simulation into the A characteristic sound pressure level. The frequency characteristic of acoustic noise depends on the vibration characteristic of the evaluation component and the resonant mode of the mounting substrate 21. Therefore, results of the simulation illustrated in FIG. 10(b) are in good agreement with the actual measured value illustrated in FIG. 10(a) in the sound pressure level and the frequency characteristic particularly in a high sound pressure and a low frequency region of 10 kHz or less. Therefore, it is possible to confirm the influence on acoustic noise when changing the mounting structure or a structure of the evaluation component itself by performing the simulation using the parameters.

Figure 13:
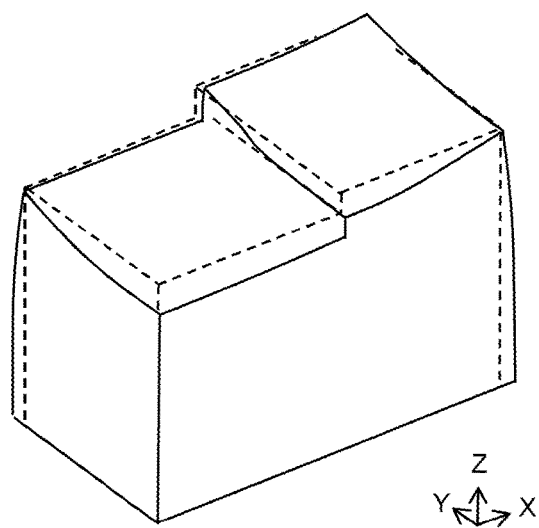
Figure 13:
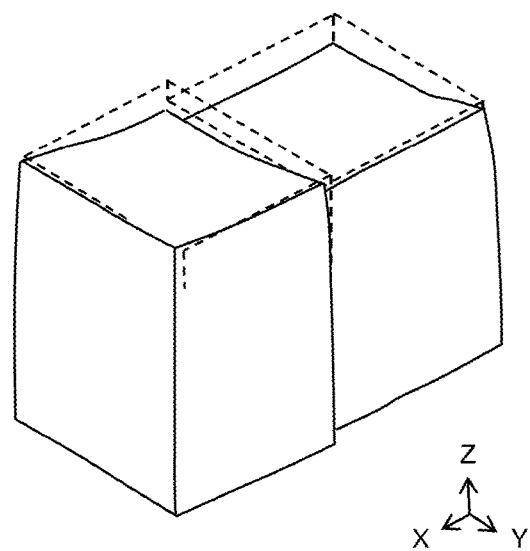
Figure 14:
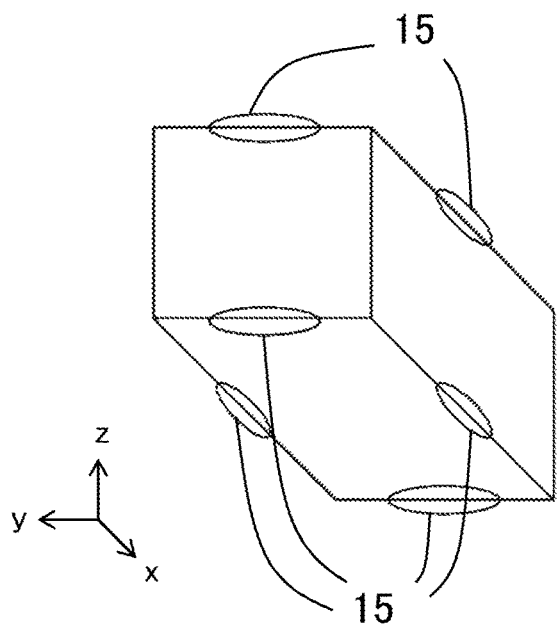
FIG. 14 is a perspective view schematically illustrating node-shaped sections of a vibration mode in the laminated ceramic capacitor of the related art.

In addition, a vibration mode was calculated in the audible frequency region (20 Hz to 20 kHz) of the evaluation component using the obtained parameters. The ⅛ model was used in the calculation. A calculation result in 10 kHz is illustrated in FIG. 13. Moreover, FIG. 13(a) is a view as viewed from an inner side (symmetry plane side) of the ⅛ model and FIG. 13(b) is a view as viewed on a side opposite to FIG. 13(a), that is, from an outside (surface side) of the ⅛ model. Here, a broken line indicates a shape of the evaluation component of a state where the AC voltage is not applied and a solid line indicates a shape of the evaluation component in a state of maximum displacement by the AC voltage. From the results, it can be seen that the evaluation component in the audible frequency region performs expanding vibration in the direction of laminated surface and performs stretching vibration in a thickness direction (direction of lamination). From the results, as illustrated in FIG. 14 schematically indicating the entire evaluation component, it can be seen that regions in which the vibration amplitude is small, that is, regions 15 (hereinafter, node-shaped sections) which can be regarded as nodes of vibration exist in the center portion of each side in two principal surfaces positioned in the direction of lamination of the evaluation component. The node-shaped sections 15 also exist in the laminated electronic component 1 of the embodiment as in the evaluation component. Therefore, it is thought that when fixing the laminated electronic component 1 to the substrate 12 via the first conductors 3 and the conductive layers 14 such as solder, the laminated electronic component 1 is fixed in the node-shaped sections 15 and thereby propagation of the piezoelectric vibration of the laminated electronic component 1 to the substrate 12 is suppressed, and acoustic noise can be reduced.

In the embodiment, it is possible to fix the node-shaped sections 15 of the stacked body to the substrate 12 via the first conductors 3 by providing the first conductors 3 on the node-shaped sections 15 existing in the laminated electronic component 1.

Even if the lead-out sections 6a exist only in a part of the direction of lamination, that is, in the vicinity of the first principal surface 7A, simulation of acoustic noise was performed using the following model of the embodiment to confirm that the node-shaped sections 15 of the vibration exist and an effect is achieved on reduction of acoustic noise by the embodiment. External dimensions of the stacked body 2 are the same as those of the evaluation component and the internal electrode layers 6 having the lead-out sections 6a are disposed in a range of 90 µm from the first principal surface 7A in the direction of lamination. As illustrated in FIG. 2(b), the lead-out sections 6a are exposed at a width 260 µm in the vicinity of the center portions 8c of the long sides 8 in the first side surfaces 10 and are electrically connected to the first conductors 3. As illustrated in FIGS. 2(c) and 3, in the first conductor 3, W1 was 280 μm, H1 was 100 μm, and P1 was 80 μm. In addition, in the mounting structure of the embodiment, C was 70 μm. Other conditions regarding the laminated electronic component 1 were the same as those of the simulation of acoustic noise in the evaluation component described above.

Figure 4:
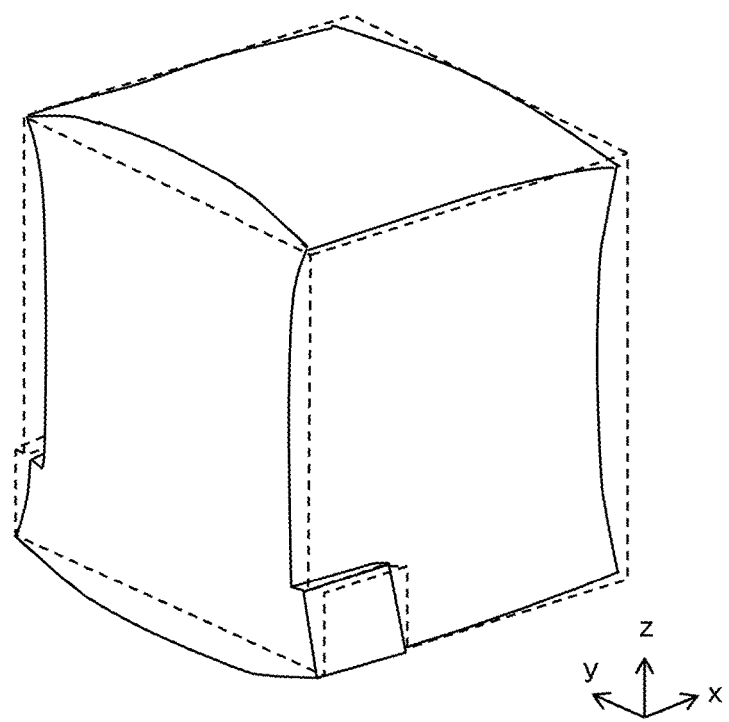
FIG. 4 is a perspective view of a calculation result of a vibration mode of the laminated electronic component at 10 kHz as viewed from a symmetry plane side in the first embodiment.

FIG. 4 illustrates a vibration mode of the laminated electronic component 1 of the embodiment in 10 kHz. Moreover, in the calculation of the vibration mode, a ½ model was used in consideration of the symmetry of the laminated electronic component 1 of the embodiment. FIG. 4 illustrates the ½ model as viewed from the symmetry plane side. Here, a broken line indicates a shape of the laminated electronic component 1 of a state where the AC voltage is not applied and a solid line indicates a shape of the laminated electronic component 1 in a state where the laminated electronic component 1 is displaced to the maximum level by the AC voltage. It can be confirmed that the node-shaped sections 15 of the vibration exist in the center portion of the long side 8 and the short side 9 constituting the principal surface 7. Moreover, in the simulation of the vibration mode of the embodiment, a model in which P1 of the first conductor 3 is 0 μm was used.

If results obtained by the simulation of the sound pressure in the embodiment are averaged over a frequency region of 5 Hz to 20 kHz, an average value of the sound pressure level was reduced by 19 dBa with respect to the mounting structure of the related art.

Moreover, in the embodiment, in the simulation described above, a ratio (W1/L1) of W1 (280 μm) to L1 (1100 μm) was set to 0.25, but even if the ratio is set to 0.35, the sound pressure level can be reduced by approximately 10 dBA with respect to that of the related art. In addition, it is preferable that W1/L1 is equal to or greater than 0.2 from the viewpoint of mountability.

Moreover, in the mounting structure of the embodiment, the laminated electronic component 1 does not directivity come into contact with the mounting surface of the substrate 12. Particularly, a ratio (C/H0) of C that is the gap between the laminated electronic component 1 and the mounting surface of the substrate 12 to H0 is equal to or greater than 0.05, particularly, is equal to or greater than 0.1.

Furthermore, according to the results of the vibration mode analysis of the evaluation component described above and the embodiment, since the vibration amplitude is large in the vicinity of the center of each surface constituting the stacked body 2, it is preferable that a ratio (H1/H0) of H1 to H0 is equal to or less than 0.4. In addition, since the vibration amplitude is large in the vicinity of the center even in the principal surface 7, a length P1 of the first conductor 3 in a direction perpendicular to the long side 8 is equal to or less than 0.25 as a ratio (P1/L2) to L2.

As described above, in the embodiment, the laminated electronic component 1 is fixed to the substrate 12 by the first conductors 3. Therefore, the first conductors 3 are disposed in the node-shaped sections 15 of the laminated electronic component 1, that is, in portions which include the center portions 8c of the long sides 8 of the first principal surface 7A and do not include the vertexes V of the stacked body 2, and thereby acoustic noise can be suppressed. On the other hand, the second conductors 4 are responsible for electrical connection between the internal electrode layers 6 and do not contribute to fixation with the substrate 12. Therefore, the second conductors 4 do not come into contact with the substrate 12, may be disposed in positions spaced apart from the first conductors 3 on the outer surface of the stacked body 2, and may be disposed so as to include the centers of the first and second side surfaces 10 and 11 and the vertexes V of the stacked body 2.

As illustrated in FIG. 1, for example, the second conductors 4 may be substantially disposed over the entire surface of the second side surfaces 11 (side surfaces on which the side surface sections 3a of the first conductors 3 are not provided) or may be disposed on the second side surfaces 11 only in a part in a direction (y-axis direction) of the short side and over an entirety in the direction of lamination (z-axis direction) (across from the short side 9 of the first principal surface 7A to the short side 9 of the second principal surface 7B). It maybe disposed so as to include the short side 9 of the second principal surface 7B and not to include the short side 9 of the first principal surface 7A.

Figure 5:
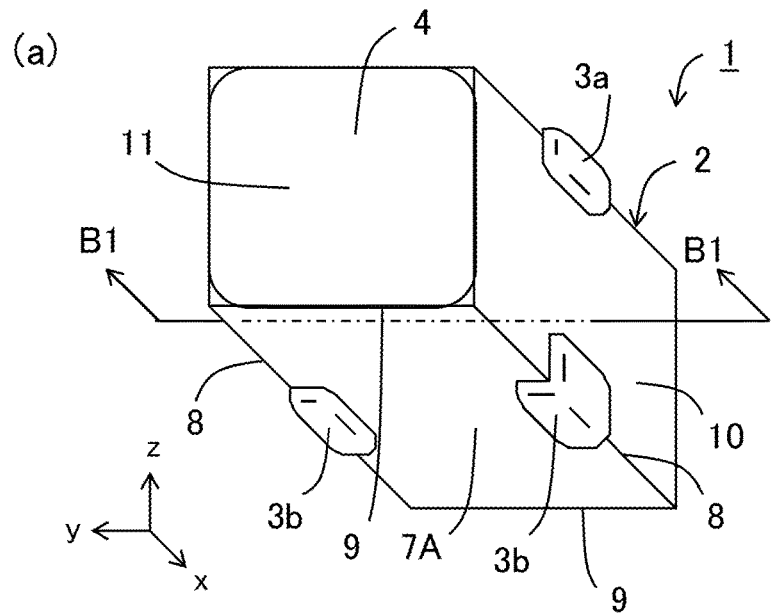
Figure 5:
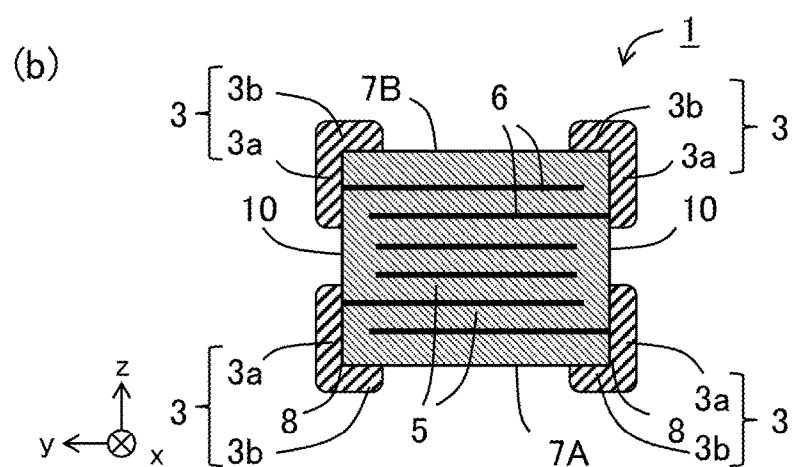

Moreover, in the embodiment, the first conductors 3 may be disposed not only on portions of the first principal surface 7A side but also on the same portions of the second principal surface 7B side as illustrated in FIG. 5. It is preferable that dispositions of the first conductors 3 disposed on the second principal surface 7B side are symmetrical with those on the first principal surface 7A side in the vertical direction. Therefore, all the first conductors 3 disposed on the first and second principal surface 7A and 7B sides can be used as electrodes for the substrate connection and facilitate mounting.

<Second Embodiment>

Figure 6:
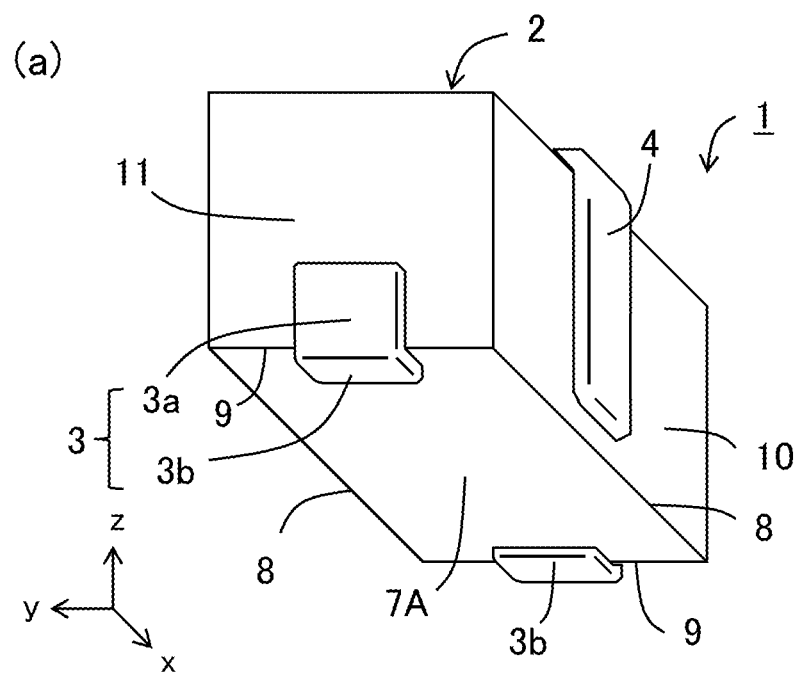
Figure 6:
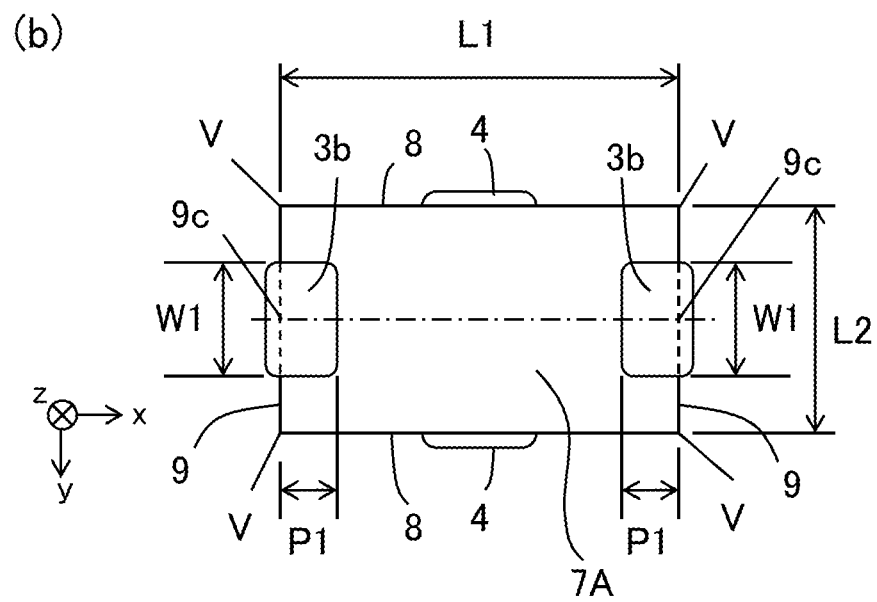

In a second embodiment, as illustrated in FIG. 6, first conductors 3 are disposed so as to include center portions 9c of short sides 9 and have side surface sections 3a extending on second side surfaces 11. Second conductors 4 are disposed on first side surfaces 10. In the first embodiment, an example in which the second conductors 4 are disposed substantially over the entire surfaces of the second side surfaces 11 in which the first conductors 3 are not provided, is illustrated, but as in the second embodiment, the second conductors 4 may be provided only in a part of the first side surfaces 10 in which the first conductors 3 are not provided. In addition, the second conductors 4 is only required to be spaced apart from the first conductors 3 on an outer surface of a stacked body 2 and a part thereof may go around to first and second principal surfaces 7A and 7B, or the side surfaces in which side surface sections 3a of the first conductors 3 are provided.

<Third Embodiment>

Figure 7:
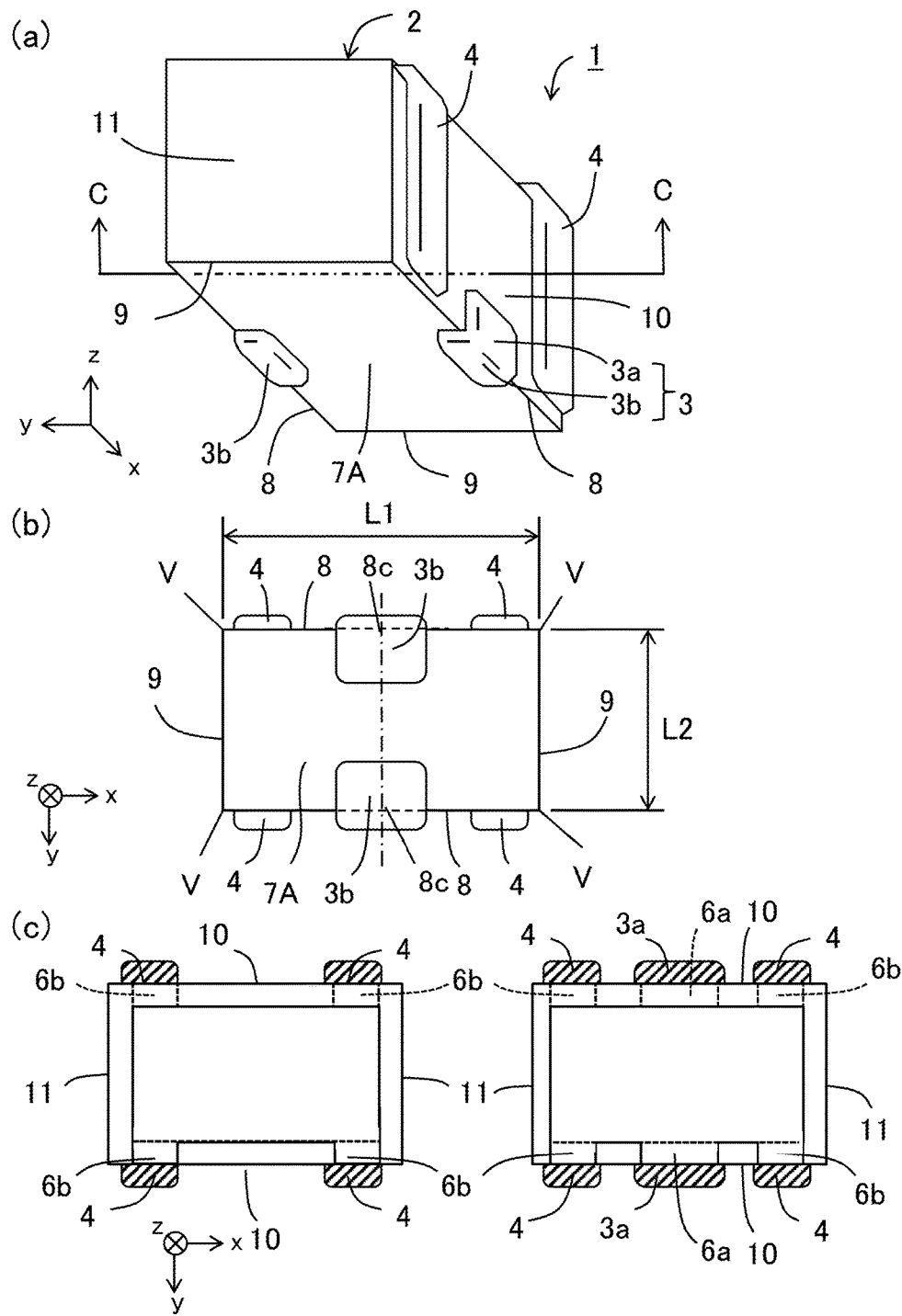
FIG. 7 illustrates a laminated electronic component along a third embodiment, in which FIG. 7 (a) is a perspective view, FIG. 7 (b) is a plan view as viewed from the first principal surface side of FIG. 7(a), and FIG. 7 (c) is a sectional view of line C-C of FIG. 7 (a)

In a third embodiment, as illustrated in FIG. 7, first conductors 3 are provided so as to include center portions 8c of long sides 8 and have side surface sections 3a extending on first side surfaces 10. In the embodiment, two pairs of second conductors 4 are disposed on the first side surfaces 10 similar to the first conductors 3. In the embodiment, internal electrode layers 6 including lead-out sections 6a and 6b indicated on a right side of FIG. 7 (c) are positioned on a first principal surface 7A side of a center portion in the direction of lamination.

As described above, the second conductors 4 is only required to be spaced apart from the first conductors 3 in the first side surfaces 10, may be disposed on the same side surfaces as the side surface sections 3a of the first conductors 3, or may be disposed on a boundary between the first side surface 10 and the second side surface 11. In addition, the second conductors 4 may be not only one pair but also two or more pairs.

In addition, the internal electrode layer 6 including only the lead-out section 6a may be provided. That is, the internal electrode layer 6 including only the lead-out section 6a may be disposed closest to the first principal surface 7A of the stacked body 2, the internal electrode layers 6 including the lead-out section 6a and the lead-out section 6b, and the internal electrode layers 6 including only the lead-out sections 6b may be sequentially disposed and thereby the second conductors 4 may be disposed spaced apart from the long side 8 or the short side 9.

In each embodiment described above, the shape and the disposition of the internal electrode layers 6 may be appropriately changed according to the disposition of the first conductors 3 and the second conductors 4.

Moreover, in each embodiment described above, for the first conductors 3 and the second conductors 4, the shapes thereof are mainly formed in rectangular shapes and preferable ranges of the dimensions and ratios are described, but the shapes of the first conductor 3 and the second conductor 4 are not limited to the rectangular shape, and other various shapes and irregular shapes are acceptable. In addition, various changes and modifications can be made without departing from the scope of the invention based on the description regarding the vibration modes and the node-shaped sections 15 of the laminated electronic component 1 confirmed by the simulation described above.

The invention is particularly suitably used in a case where, for example, a laminated ceramic capacitor, which uses a ferroelectric material such as barium titanate based material for the dielectric layer 5 and uses a metal material such as Ni, Cu, Ag, and Ag—Pd for the internal electrode layer 6, is the laminated electronic component 1. Also in other laminated electronic components 1, it is applicable to a case where it is necessary to suppress excitation of the substrate 12 on which the laminated electronic component 1 is mounted and the like due to the piezoelectric vibration of the laminated electronic component 1 itself. The invention can exert a remarkable effect particularly in the laminated electronic component 1 of a model of Type 1005 or larger (external dimensions of Type 1005 or larger).

The invention is applicable to various existing laminated electronic components 1. In addition, there is also an advantage that a special jig is not required for mounting on the substrate 12.

Moreover, in the embodiment, although the laminated ceramic capacitor having a general shape is described as an example of the laminated electronic component 1, in addition, it is applicable to a laminated electronic component 1 of a thin type or having various structures.

Furthermore, as the first conductor 3 and the second conductor 4, for example, a material which is obtained by plating Ni and Sn on a base electrode made of Cu which is often used as the external electrode of the laminated ceramic capacitor, may be employed, but the first conductor 3 and the second conductor 4 which are composed only of a plating electrode without using the base electrode, can be suitably used. Since the base electrode composed of Cu is relatively soft, the piezoelectric vibration of the stacked body 2 is absorbed and attenuated to some extent, but in a case of only the plating electrode, the piezoelectric vibration of the stacked body 2 is not attenuated by the first conductor 3 and acoustic noise is remarkable. Therefore, it is possible to obtain a larger acoustic noise suppression effect by applying the invention.

REFERENCE SIGNS LIST

1: Laminated electronic component
2, 102: Stacked body
3: First conductor
103: External electrode
4: Second conductor
5, 105: Dielectric layer
6, 106: Internal electrode layer
7A: First principal surface
7B: Second principal surface
8: Long side
8c: Center of long side
9: Short side
9c: Center of short side
10: First side surface
11: Second side surface
12: Substrate
13: Land pattern
14, 114: Solder
15: Node-shaped section
21: Mounting substrate
22: Anechoic box
23: Sound collecting microphone
24: Amplifier
25: FET analyzer

The invention claimed is:
1. A laminated electronic component comprising:
a stacked body having a rectangular parallelepiped shape, the stacked body comprising dielectric layers and internal electrode layers which are alternately laminated; and
a pair of first conductors and a pair of second conductors disposed on an outer surface of the stacked body,
the stacked body comprising a pair of first and second principal surfaces which has a rectangular shape and is positioned in a direction of lamination of the dielectric layers and the internal electrode layers, a pair of first side surfaces adjacent to long sides of the pair of first and second principal surfaces, and a pair of second side surfaces adjacent to short sides of the pair of first and second principal surfaces,
the pair of first conductors being disposed in portions which include centers of the short sides of the first principal surface, and do not include the second principal surface and a vertex of the stacked body, and the pair of first conductors comprising side surface sections which extend from the short sides on the pair of second side surfaces, and projection sections which extend from the short sides on the first principal surface,
the pair of second conductors being disposed on the pair of first side surfaces or the pair of second side surfaces, and
the pair of first conductors and the pair of second conductors being spaced apart from each other on the outer surface and electrically connected to each other via the internal electrode layers,
in the direction of lamination of the dielectric layers and the internal electrode layers, a ratio of a length of each of the side surface sections of the pair of first conductors to a length of the stacked body is equal to or less than 0.4,
wherein when a length of the long sides is denoted by L and a length of the pair of first conductors along the short sides is denoted by W, a ratio of W to L is equal to or less than 0.35.
2. The laminated electronic component according to claim 1, wherein the side surface sections of the pair of first conductors, and the pair of second conductors are respectively disposed on different side surfaces among the pair of first side surfaces and the pair of second side surfaces.

3. The laminated electronic component according to claim 1, wherein the side surface sections of the pair of first conductors and the pair of second conductors are disposed on one of the pair of first side surfaces and the pair of second side surfaces.

4. The laminated electronic component according to claim 1, wherein the pair of second conductors is disposed over an entirety in the direction of lamination of the pair of first side surfaces or the pair of second side surfaces.

5. A mounting structure, comprising:
   the laminated electronic component according to claim 1; and
   a substrate which is joined with the projection sections of the pair of first conductors of the laminated electronic component.

* * * * *